(12) United States Patent
Proell et al.

(10) Patent No.: US 6,970,389 B2
(45) Date of Patent: Nov. 29, 2005

(54) INTEGRATED MEMORY

(75) Inventors: Manfred Proell, Dorfen (DE); Stephan Schroeder, München (DE); Herbert Benzinger, München (DE); Aurel von Campenhausen, München (DE)

(73) Assignee: Infineon Technologies, AG, (DE)

( * ) Notice: Subject to any disclaimer, the term of this patent is extended or adjusted under 35 U.S.C. 154(b) by 121 days.

(21) Appl. No.: 10/757,594

(22) Filed: Jan. 15, 2004

(65) Prior Publication Data

US 2004/0156254 A1    Aug. 12, 2004

(30) Foreign Application Priority Data

Jan. 17, 2003   (DE) ................. 103 01 856

(51) Int. Cl.[7] .............................. G11C 7/02
(52) U.S. Cl. .................. 365/205; 365/190; 365/189.08
(58) Field of Search ............... 365/205, 190, 365/189.08

(56) References Cited

U.S. PATENT DOCUMENTS 4,807,195 A * 2/1989 Busch et al. ............... 365/207
5,801,983 A   9/1998 Saeki
5,940,339 A * 8/1999 Shirley et al. ............. 365/207

FOREIGN PATENT DOCUMENTS

JP           05-54633        3/1993

OTHER PUBLICATIONS

Min, D.-S, et al., "Multiple Twisted Dataline Techniques for Multigigabit DRAM's", IEEE Journal of Solid-State Circuits, vol. 34, No. 6, Jun. 1999, pp. 856-865.

* cited by examiner

*Primary Examiner*—Connie C. Yoha
(74) *Attorney, Agent, or Firm*—Edell, Shapiro & Finnan, LLC

(57) ABSTRACT

An integrated memory can include a memory cell array, which has word lines for the selection of memory cells, bit lines for reading out or writing data signals of the memory cells, and a sense amplifier connected to bit lines of a bit line pair at one end of the bit line pair. In an activated state during a memory access, at least one activatable isolation circuit which is switched into one of the bit line pairs can isolate a part of the bit line pair, which is more remote from the sense amplifier from the sense amplifier. As a result, the effective capacitance of the bit lines can be significantly reduced during the memory access.

4 Claims, 2 Drawing Sheets

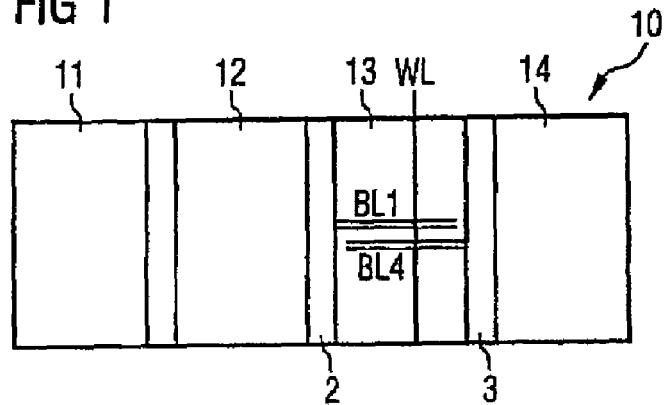
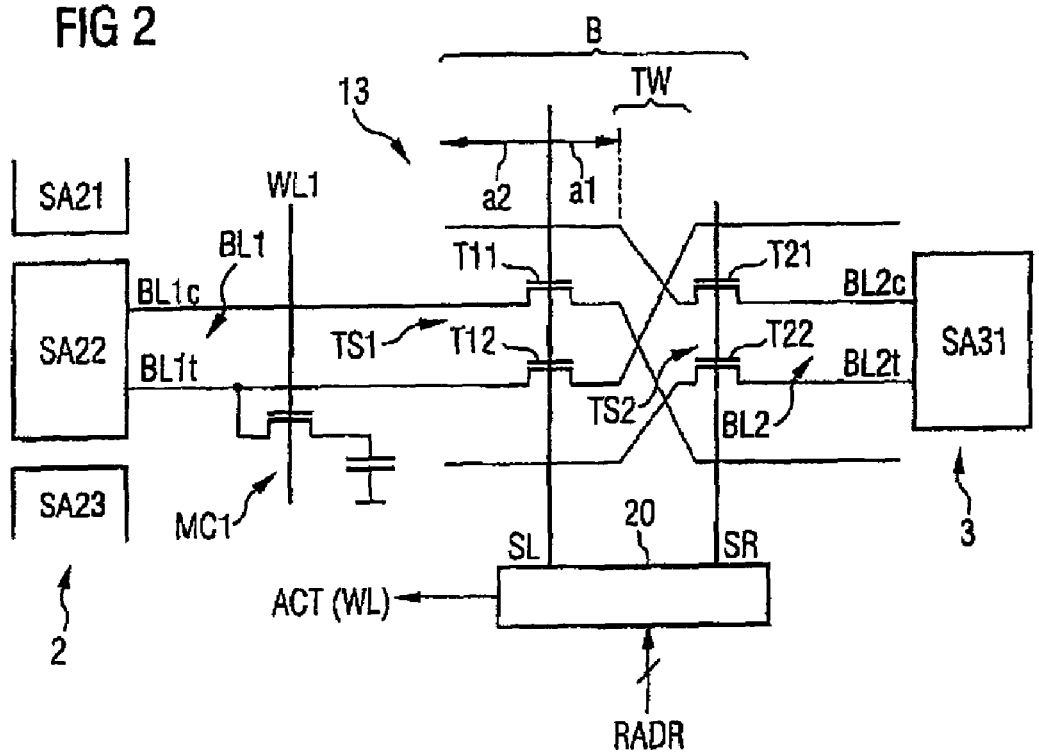

INTEGRATED MEMORY

CROSS REFERENCE TO RELATED APPLICATIONS

This application claims priority under 35 USC §119 to German Application No. 10301856.5, filed on Jan. 17, 2003, and titled "Integrated Memory," the entire contents of which are hereby incorporated by reference.

FIELD OF THE INVENTION

The present invention relates to an integrated memory having a memory cell array, which has word lines for the selection of memory cells and bit lines for reading out or writing data signals of the memory cells.

BACKGROUND

An integrated memory for instance in the form of a DRAM (Dynamic Random Access Memory) generally has a memory cell array, which comprises word lines and bit lines. The memory cells, in each case, are arranged at crossover points of the word lines and bit lines. The memory cells usually used in integrated dynamic random access memories have a storage capacitance and a selection transistor. The storage capacitances of the memory cells are, in each case, connected via the selection transistor to one of the bit lines by which a data signal is read out or written in. The control input of the selection transistor is connected to one of the word lines. A word line selects selection transistors from corresponding memory cells along the word line. The selection transistors are opened. If the respective selection transistor is open, then the charge stored in the cell capacitance can pass onto the corresponding bit line and from there into a read-write amplifier.

During a memory access, a word line is activated. As a result, the memory cells arranged along a word line are, in each case, conductively connected to a bit line via the respective selection transistor. In this case, the stored charge is divided up in accordance with the memory cell capacitance and bit line capacitance. In accordance with the ratio of these two capacitances (i.e., transfer ratio), this leads to a deflection of the bit line voltage. The sense amplifier situated at one end of the bit line compares this voltage with the constant voltage on the associated complementary bit line and amplifies the relatively small potential difference between the bit line and the complementary bit line until the bit line has reached the full signal level for a stored logic 1, which, for example, corresponds to a positive supply potential, or the signal level for a logic 0, which, for example, corresponds to a reference potential. The inverse signal levels are reached at the same time on the associated complementary bit line. Since the relevant selection transistor remains open during this operation, the signal is simultaneously written back to the memory cell again (i.e., a refresh). As a result, any losses of the stored charge caused by leakage can be compensated for again. Therefore, during the memory access described not only is the memory cell capacitance charged, but it is necessary for the entire capacitance of the corresponding bit lines to be subjected to charge reversal.

In order to achieve a compact arrangement of the memory cell array, the longest possible bit lines are sought. However, this leads to correspondingly high bit line capacitances. The consequence is a reduction of the memory cell signal to be detected by the sense amplifier as a result of impairment of the transfer ratio and an increased coupling between adjacent bit lines with disturbing crosstalk.

SUMMARY

The present invention is based on specifying an integrated memory with a reduced bit line capacitance that is effective for a memory access.

An integrated memory can include at least one activatable isolation circuit, which is switched into a bit line pair connected to the sense amplifier. The isolation circuit can be activated by a corresponding control signal and, in the activated state during an access to the memory cell array, can isolate a part of the bit line pair, which is remote from the sense amplifier, from the sense amplifier. As a result, the effective capacitance of this bit line pair can be significantly reduced during the memory access. The transfer ratio for the "shortened arm" of the bit lines and the memory cell signal to be detected by the sense amplifier can be correspondingly increased. In addition, the charge-reversal current required during the writing-back process can be reduced. At the same time, physically relatively long bit lines can be possible.

In one embodiment of the invention, the isolation circuit can be arranged within a region significantly smaller relative to the memory cell array and arranged centrally relative to a longitudinal extent of the relevant bit line pair. In this embodiment, the effective capacitance of the relevant bit lines can be approximately halved during the memory access, since the "shortened arm" of the bit line during the memory access approximately corresponds to half of the physical length of the respective bit line. Since about half the capacitance of a bit line can be subject to charge reversal for a memory access, a correspondingly significant current reduction can result during the memory access.

The bit lines of the memory can be provided with a bit line twist to further minimize the bit line coupling. For this purpose, the bit lines of the memory can be organized in bit line pairs. The bit lines of a bit line pair can cross one another at a crossing location, i.e., the bit line twist, and can run parallel to one another. Since a bit line twist, which can be generally arranged in the center of the memory cell array, can interrupt the regular structure of the memory cell array, the isolation circuit can be arrayed in the vicinity of the bit line twist. Accordingly, the distance from the isolation circuit to the crossing location of the bit line twist can be significantly smaller than the distance to the sense amplifier.

BRIEF DESCRIPTION OF THE DRAWINGS

The invention is explained in more detail with reference to the FIGS. illustrated in the drawings.

FIG. 1 is a diagrammatic illustration of an embodiment of a memory cell array of an integrated memory;

FIG. 2 illustrates an embodiment of a partial circuit of an integrated memory with isolation circuits according to the invention.

DETAILED DESCRIPTION

Figure 3:
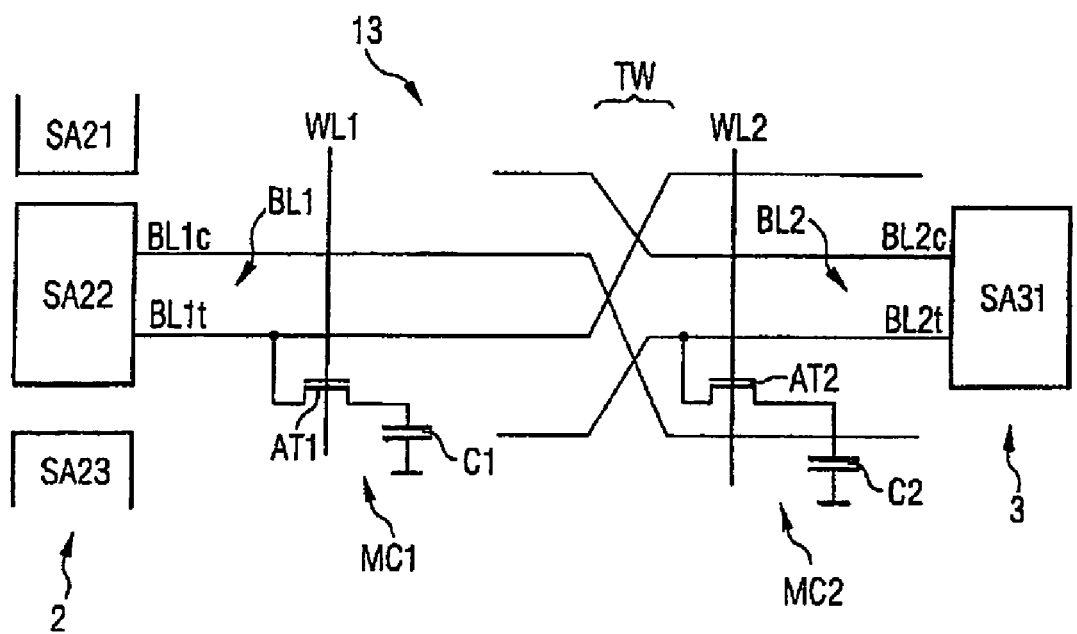
FIG. 3 shows a partial circuit of an integrated memory according to the prior art.

A memory cell array of an integrated memory 10 can be subdivided into blocks, as shown in FIG. 1. In this case, the memory cell blocks can be formed by individual memory cell arrays 11, 12, 13, 14. As illustrated in greater detail on the basis of the memory cell array 13, the individual memory cell arrays can have word lines WL for the selection of memory cells and bit lines, for example, on bit lines BL1 and BL4, for reading out or writing data signals of the memory cells. The memory cells (not illustrated here) can be arranged in a known manner at crossover points of the word lines and bit lines and can be, respectively, connected to one of the word lines and one of the bit lines. The bit lines can be organized in bit line pairs. The bit lines of a bit line pair can run parallel to one another over wide regions, as indicated in FIG. 1.

The memory cell array 13 can be bound by the sense amplifier strips 2 and 3. The bit line pairs can be connected alternately to one of the sense amplifiers of the sense amplifier strip 2 and to one of the sense amplifiers of the sense amplifier strip 3 in the longitudinal direction of the sense amplifier strips. A compact arrangement of a memory cell array can be possible, since the respective sense amplifiers are arranged opposite one another in a space-saving manner.

FIG. 3 shows a partial circuit of an integrated memory according to the prior art. Individual sense amplifiers SA21, SA22, SA23 are arranged in the sense amplifier strip 2. The sense amplifier SA31 is situated in the sense amplifier strip 3. The word lines WL1, WL2 and also the bit lines BL1, BL2 are arranged in the memory cell array 13. The bit lines BL1, BL2 are organized in bit line pairs, comprising the bit lines BL1c, BL1t, BL2c, BL2t. The bit lines BL1c, BL1t cross one another at a crossing location, a bit line twist TW, and run parallel to one another. The course of the bit lines BL2c, BL2t changes in accordance with the bit lines BL1c, BL1t at the bit line twist TW.

The memory cells MC1, MC2 are, in each case, arranged at crossover points of the word lines and bit lines. The memory cells MC1, MC2 each have a selection transistor AT1, AT2 and a storage capacitance C1, C2. The control input of the selection transistors AT1, AT2 is connected to the word line WL1 and WL2, respectively, by which the memory cells are activated during a memory access. For this purpose, the selection transistors AT1, AT2 are turned on by the word lines WL1, WL2. If the respective selection transistor is open, the charge stored in the respective memory cell capacitance C1, C2 can pass to the corresponding bit line BL1t, BL2t, respectively, and from there into the sense amplifier SA22, SA31, respectively. The provision of the bit line twist TW reduces the bit line coupling particularly in the case of comparatively long bit lines. In this case, the bit line twist TW is arranged approximately in the center of a respective bit line.

FIG. 2 shows a partial circuit of an integrated memory according to the invention. The illustration of the word line WL2 and of the memory cell MC2 has been dispensed with in FIG. 2 for the sake of clarity. For better clarity, only the memory cell MC1, the word line WL1, and the bit lines BL1, BL2 are illustrated in FIG. 2. In reality, a multiplicity of memory cells, word lines, and bit lines can be provided in each case. In contrast to the memory of FIG. 3, at the bit line twist TW, a respective isolation circuit TS1, TS2 can be switched into the bit line pair BL1, BL2, respectively. The isolation circuits TS1, TS2 can have respective isolation transistors T11 to T22, which can be switched into the bit lines BL1c, BL1t, BL2c, BL2t of a bit line pair. The isolation transistors T11, T12 can be activated by a control line SL, and the isolation transistors T21, T22 can be activated by a control line SR. In this case, activatable or activated means that the isolation transistors undergo transition to a non-conducting state and isolate that part of the respective bit line, which is more remote from the respective sense amplifier SA22, SA31, from the corresponding sense amplifiers.

In this case, the activation of the isolation transistors can be carried out during an access to the memory cell array so that the respective sense amplifier connected to one end of a bit line can be subject to the capacitance of a "shortened arm" of a bit line to charge reversal. As a result, the transfer ratio for the "shortened arm" of the corresponding bit line and the memory cell signal to be detected by the sense amplifier can be correspondingly increased. In addition, the charge-reversal current required during the writing-back process can be reduced. The activation of the isolation transistors T11 to T22 is performed by means of the word line address decoder 20, which can select and activate word lines for a memory access by activation signal ACT (WL).

The jointly driven isolation transistors T11, T12 and T21, T22, respectively, are arranged so that, in the longitudinal direction of the sense amplifier strips 2, 3, for every second bit line pair, that end of the bit line pair, which is remote from the respective sense amplifier, can be switched off. The effective capacitance of a bit line pair can be halved as a result. Since half the capacitance can be subject to charge reversal on every second bit line pair, a current reduction of about 25% results for each word line access. In this case, the address decoder 20, at which the row address RADR can be present, defines whether the "right-hand" or "left-hand" bit line half can be switched off.

The isolation transistors T11 to T22 of the isolation circuits TS1, TS2 can be arranged within a region B, which is significantly smaller relative to the memory cell array 13 and can be arranged centrally relative to the longitudinal extent of the bit lines BL1, BL2. The bit line twist TW can be arranged within the region B. The central arrangement of the bit line twist TW is illustrated in distorted fashion in FIG. 2 for reasons of clarity. Since this bit line twist TW interrupts the regular structure of the memory cell array 13, the isolation circuits TS1, TS2 can be arranged in the vicinity of said bit line twist TW. For example, with reference to the isolation circuit TS1, the distance a1 between the isolation circuit and the bit line twist TW is significantly less than the distance a2 between the isolation circuit and the sense amplifier SA22.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| 2, 3 | Sense amplifier strip |
| 10 | Memory |
| 11 to 14 | Memory cell array |
| 20 | Address decoder |
| WL, WL1, WL2 | Word line |
| BL1, BL2, BL4 | Bit line |
| BL1c, BL1t | Bit line |
| BL2c, BL2t | Bit line |
| SL, SR | Control line |
| T11 to T22 | Isolation transistor |
| AT1, AT2 | Selection transistor |
| C1, C2 | Memory cell capacitance |
| MC1, MC2 | Memory cell |
| TW | Bit line twist |
| SA21 to SA23 | Sense amplifier |
| SA31 | Sense amplifier |
| a1, a2 | Distance |

-continued

List of reference symbols

| | |
|---|---|
| B | Region |
| RADR | Row address |
| ACT(WL) | Activation signal |
| TS1, TS2 | Activation circuit |

What is claimed is:

1. An integrated memory, comprising:
a memory cell array, the memory cell array including a plurality of word lines for the selection of memory cells and a plurality of bit lines for reading out or writing data signals of the memory cells, the bit lines being organized in bit line pairs, the bit lines of a bit line pair crossing one another at a crossing location, the bit lines running parallel to one another;
a sense amplifier, the sense amplifier being connected to one of the bit line pairs at one end of the bit line pair; and
at least one activatable isolation circuit, the isolation circuit being switched into one of the bit line pairs, wherein the activated state during an access to the memory cell array, the isolation circuit isolating a part of one of the bit line pairs which is more remote from the sense amplifier, from the sense amplifier circuit being arranged at a first distance from the crossing location and at a second distance from the sense amplifier, the first distance being less than the second distance.

2. The integrated memory as claimed in claim 1, wherein the at least one isolation circuit is arranged within a region, the region being significantly smaller relative to the memory cell array, the region being arranged centrally relative to the longitudinal extent of the relevant bit line pair.

3. The integrated memory as claimed in claim 1 wherein the at least one isolation circuit is activated by a word line decoder for the selection of one of the word lines for the memory access.

4. The integrated memory as claimed in claim 1, wherein at least one first and second sense amplifier strip are provided within the memory cell array,
the bit line pairs, are alternately connected to a sense amplifier of the first sense amplifier strip and a sense amplifier of the second amplifier strip in the longitudinal direction of the sense amplifier strips, and
a plurality of isolation circuits are provided, the isolation circuits being arranged and designed such that, in the activated state, in the longitudinal direction of the sense amplifier strips, for each second bit line pair, a part of the respective bit line pair, which is more remote from the respective sense amplifier, can be isolated from the sense amplifier by one of the isolation circuits.

\* \* \* \* \*